(12) United States Patent
Suh et al.

(10) Patent No.: US 7,579,199 B2
(45) Date of Patent: *Aug. 25, 2009

(54) TFT, FLAT PANEL DISPLAY DEVICE HAVING THE SAME, METHOD OF MANUFACTURING TFT, METHOD OF MANUFACTURING FLAT PANEL DISPLAY DEVICE, AND METHOD OF MANUFACTURING DONOR SHEET

(75) Inventors: Min-Chul Suh, Seongnam-si (KR); Nam-Choul Yang, Seoul (KR); Jae-Bon Koo, Yongin-si (KR); Hye-Dong Kim, Seongnam-si (KR); Ho-Kyoon Chung, Yongin-si (KR); Ul-Ho Lee, Yongin-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/004,404

(22) Filed: Dec. 21, 2007

(65) Prior Publication Data

US 2008/0176349 A1      Jul. 24, 2008

Related U.S. Application Data

(62) Division of application No. 10/995,537, filed on Nov. 24, 2004, now Pat. No. 7,378,711.

(30) Foreign Application Priority Data

Feb. 26, 2004 (KR) .................. 2004-13007
Apr. 19, 2004 (KR) .................. 2004-26648

(51) Int. Cl.
*H01L 21/00* (2006.01)
(52) U.S. Cl. .................. 438/22; 438/28; 438/149

(58) Field of Classification Search .................. 438/22, 438/28, 30, 34, 149–167
See application file for complete search history.

(56) References Cited

U.S. PATENT DOCUMENTS

| | | | |
|---|---|---|---|
| 6,586,787 B1 | 7/2003 | Shih et al. | |
| 6,653,653 B2 | 11/2003 | Brousseau | |
| 7,051,945 B2 | 5/2006 | Empedocles et al. | |
| 7,381,579 B2 * | 6/2008 | Suh et al. | 438/22 |
| 2004/0266073 A1 | 12/2004 | Yamazaki | |
| 2006/0214156 A1 | 9/2006 | Pan et al. | |

FOREIGN PATENT DOCUMENTS

| | | |
|---|---|---|
| CN | 1366345 | 8/2002 |
| JP | 2004-507104 | 3/2004 |
| JP | 2006-501689 | 1/2006 |

OTHER PUBLICATIONS

*High-Performance Thin-Film Transistors Using Semiconductor Nanowires and Nonoribbons* by Xiangfeng Duan et al., published in *Letters to Nature*.

(Continued)

*Primary Examiner*—Kevin M Picardat
(74) *Attorney, Agent, or Firm*—Robert E. Bushnell, Esq.

(57) ABSTRACT

A flexible flat panel display where nanoparticles are used for the active layer of the TFTs and the substrate is flexible and can be manufactured at room temperature, a flat panel display device having the same, a method of manufacturing a TFT, a method of manufacturing a flat panel display device, and a method of manufacturing a donor sheet. In making the TFTs in the display, a donor sheet is used to transfer the nanoparticles from the sheet to the substrate. The thin film transistor is placed on a substrate and includes a channel region which has at least one P-type or N-type nanoparticle arranged in a lengthwise direction, wherein the lengthwise direction of the P-type or N-type nanoparticles is parallel to a P-type or an N-type nanoparticle line partitioned off on the substrate.

20 Claims, 10 Drawing Sheets

OTHER PUBLICATIONS

*Doping and Electrical Transport in Silicon Nanowires*, by Yi Cui et al., published in *The Journal of Physical Chemistry B*, vol. 104, No. 22, Jun. 8, 2000.

*Synthesis of p-Type Gallium Nitride Nanowires for Electronic and Photonic Nanodevices*, by Zhaohui Zhong, published in *Nano Letters*, vol. 3, No. 3, pp. 343-346 on the 20th of Feb. 2003.

*Low-Temperature Synthesis of Single-Crystal Germanium Nanowires by Chemical Vapor Deposition*, by Dunwei Wang et al., published in the *Angew. Chem. Int. Ed.* 2002, 41, No. 24, p. 4783.

*Idium Phosphide Nanowires as Building Blocks for Nanoscale Electronic and Optoelectronic Devices*, by Xiangfeng Duan et al., published in *Letters to Nature*.

*Rectifying Behavior of Electrically Aligned ZnO Nanorods*, by Oliver Harnack, et al., *Nano Letters*, vol. 3, No. 8, pp. 1097-1108 published on the 24th of Jun. 2003.

*Comparative Study of Dodecanethiol-Derivatized Silver Nanoparticles Prepared in One-Phase and Two-Phase Systems*, by So Young Kang et al., Langmuir 1998, vol. 14, pp. 226-230, published 6th Jan. 1998.

"Letters To Nature" articles published by 2003 Nature Publishing Group, pp. 274-278, vol. 425, Sep. 2003.

Japanese Office action dated Nov. 25, 2008 in corresponding Japanese Patent Application No. 2005-0516533.

Patent Certificate for Invention from Chinese Patent Office issued in Applicant's corresponding Chinese Patent No. ZL200410081922.6 dated May 13, 2009.

* cited by examiner

TFT, FLAT PANEL DISPLAY DEVICE HAVING THE SAME, METHOD OF MANUFACTURING TFT, METHOD OF MANUFACTURING FLAT PANEL DISPLAY DEVICE, AND METHOD OF MANUFACTURING DONOR SHEET

CLAIM OF PRIORITY AND CROSS-REFERENCE TO RELATED APPLICATIONS

This application makes reference to, incorporates the same herein, and claims all benefits accruing under 35 U.S.C. 119 from applications earlier filed in the Korean Intellectual Property Office on 26 Feb. 2004 and 19 Apr. 2004 and there duly assigned Serial Nos. 2004-13007 and 2004-26648, respectively. Furthermore, this application is a divisional application of Applicant's Ser. No. 10/995,537 filed in the U.S. Patent & Trademark Office on 24 Nov. 2004, now U.S. Pat. No. 7,378,711 and assigned to the assignee of the present invention.

BACKGROUND OF THE INVENTION

1. Field of the Invention

The present invention relates to a thin film transistor (TFT), a flat panel display device having the same, a method of manufacturing a TFT, a method of manufacturing a flexible flat panel display device, and a method of manufacturing a donor sheet, and more particularly, to a TFT using nanoparticles in at least a channel, a flat panel display device having the same, a method of manufacturing a TFT, a method of manufacturing a flat panel display device, and a method of manufacturing a donor sheet.

2. Description of the Related Art

A flat panel display device such as a liquid crystal display (LCD), an organic light-emitting diode (OLED) display, or an inorganic light-emitting diode display are categorized by driving methods into a passive matrix (PM) flat panel display device using a passive driving method and an active matrix (AM) flat panel display device using an active driving method.

In the PM flat panel display device, anodes and cathodes, respectively, are arranged in a plurality of columns and rows, and a scanning signal is supplied by a row driving circuit to the cathodes. In this case, only one row of the plurality of rows is selected. In addition, a data signal is input by a column driving circuit into each pixel.

The AM flat panel display device is widely used as a display device, which controls a signal input into each pixel using a thin film transistor (TFT) and is able to process an enormous amount of signals to realize a moving image.

TFTs of the AM flat panel display device include a semiconductor active layer having source/drain regions doped with high-concentration impurities and a channel region formed between the source/drain regions, gate electrodes insulated from the semiconductor active layer and placed in a region corresponding to the channel region, and source/drain electrodes each contacting each of the source/drain regions.

The semiconductor active layer is generally formed of amorphous silicon or polycrystalline silicon. Amorphous silicon can be deposited at a low temperature. However, when the semiconductor active layer is formed of amorphous silicon, electrical characteristics and reliability are lowered, and the region of a display device cannot be easily increased. In these days, polycrystalline silicon is widely used in forming the semiconductor active layer. Polycrystalline silicon has high current movement of several tens to hundreds $cm^2/V \cdot s$ and low radio frequency operating characteristics and a low leakage current value and thus is very suitable for use in a high definition and large-sized flat panel display device.

However, when the semiconductor active layer is formed of polycrystalline silicon, a crystallization process of crystallizing amorphous silicon into polycrystalline silicon needs to be carried out. This involves heating to a high-temperature of 300° C. or higher.

Preferably, flat panel display devices should be able to bend to some degree by applying a predetermined tension thereto, allowing for a sufficient view angle, or so that the display can be used in a portable products such as an arm band, a wallet, or a notebook computer.

However, when a TFT is formed of polycrystalline silicon using a conventional method, it is difficult to acquire a flexible flat panel display device. In other words, in order to make a flexible product, flexible materials such as acryl, polyimide, polycarbonate, polyester, mylar, and other plastic materials should be used in most elements including the substrate. These plastic materials have low heat resistance, and if present when polycrystalline is formed, these materials will not tolerate heat well. Thus, in order to make TFTs in the flat panel display device used in a flexible product, a method to form a structure at a temperature at which the plastic materials can withstand is needed.

SUMMARY OF THE INVENTION

It is therefore an object of the present invention to provide an improved design for a flat panel display.

It is also an object of the present invention to provide a design for a flat panel display that uses TFTs having superior electrical characteristics while being flexible.

It is further an object to provide a design for a TFYT and a flat panel display that uses the novel TFTs where the active layer of the TFTs include nanoparticles.

It is further an object of the present invention to provide a method for making the novel TFTs and a novel for making the novel flat panel display that uses the novel TFTs where nanoparticles are incorporated into the active layer of the TFTs.

These and other objects can be achieved by a thin film transistor (TFT) which has superior characteristics and can be manufactured at room temperature, a flat panel display device having the same, a method of manufacturing a TFT, a method of manufacturing a flat panel display device, and a method of manufacturing a donor sheet. According to an aspect of the present invention, there is provided a thin film transistor, the thin film transistor being placed on a substrate and including a channel region which has at least one P-type or N-type nanoparticle arranged in a lengthwise direction, wherein the lengthwise direction of the P-type or N-type nanoparticles is parallel to a P-type or an N-type nanoparticle line partitioned off on the substrate.

According to another aspect of the present invention, there is provided a thin film transistor, the thin film transistor comprising a P-type thin film transistor placed on a substrate, the P-type thin film transistor including a channel region which has at least one P-type nanoparticle arranged in a lengthwise direction; and an N-type thin film transistor placed on the substrate, the N-type thin film transistor including a channel region which has t least one N-type nanoparticle arranged in a lengthwise direction; wherein the lengthwise direction of each of the P-type and N-type nanoparticles is parallel to each of P-type and N-type nanoparticle lines partitioned off on the substrate.

According to still another aspect of the present invention, there is provided a flat panel display device, the flat panel display device having a substrate, an emission region that is placed on the substrate and in which a plurality of pixels are located, and a plurality of selection driving circuits located in each of the pixels, each of the selection driving circuits having at least one thin film transistor, the thin film transistor includes a channel region which has at least one nanoparticle arranged in a lengthwise direction, the lengthwise direction of the nanoparticle is parallel to nanoparticle lines partitioned off on the substrate.

According to yet another aspect of the present invention, there is provided a flat panel display device, the flat panel display device having an emission region where a plurality of at least one of P-type and N-type thin film transistors are located, and a non-emission region where P-type and/or N-type thin film transistors are located, the lengthwise direction of at least a channel region of the same type of thin film transistors among the thin film transistors located in the emission region and the non-emission region is parallel to one another.

According to a further aspect of the present invention, there is provided a method of manufacturing a thin film transistor having a semiconductor active layer, the method involving partitioning a plurality of nanoparticle lines, forming nanolayers on a line including at least one nanoparticle along each of the nanoparticle lines, and forming an active layer by patterning the nanolayers.

According to another aspect of the present invention, there is provided a method of manufacturing a flat panel display device having an emission region where a plurality of pixels are located and a selection driving circuit including a thin film transistor having a semiconductor active layer located in each of the pixels, the method involving partitioning a plurality of nanoparticle lines, forming nanolayers on a line including at least one nanoparticle along each of the nanoparticle lines, and forming an active layer by patterning the nanolayers.

According to a further aspect of the present invention, there is provided a method of manufacturing a donor sheet, the method involving preparing a film having one side formed of a light-to-heat conversion layer, preparing a water bank so that P-type or N-type nano particles float in a stored solution, collecting the nanoparticles to one side, allowing the film to perforate the solution in the water bank so that the nanoparticles are attached to the light-to-heat conversion layer of the film, and drying the film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

As a preliminary matter, as used herein, the term $(TMS)_2Se$ means bis(trimethylsillyl)selenium; the term TOPSe means (Tri-n-octylphosphine)selenide, and the term TBPSe means (Tributylphosphine)selenide.

Figure 1:
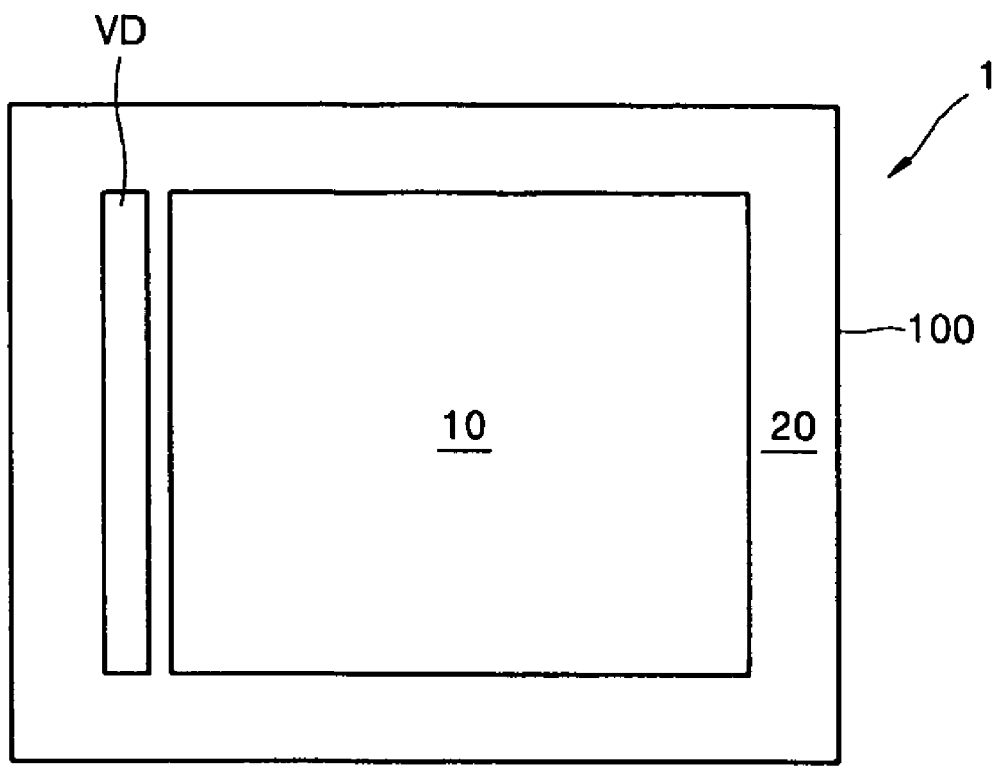
FIG. 1 is a schematic plane view of a flat panel display device according to an embodiment of the present invention.

Turning now to the figures, FIG. 1 is a schematic diagram of an emission region 10 and a non-emission region 20 of an (OLED) flat panel display 1. A plurality of subpixels where an OLED and a selection driving circuit are disposed, are located in the emission region 10 of display 1. A horizontal driver (HD) and/or a vertical driver (VD) for driving the subpixels is located in the non-emission region 20. FIG. 1 shows only the VD within the non-emission region 20, but a plurality of circuits such as the HD or a level shifter may be located in the non-emission region 20. In addition, a terminal portion connected to an external circuit and a sealing portion for sealing the emission region 10 etc. are located in the non-emission region 20.

Figure 2:
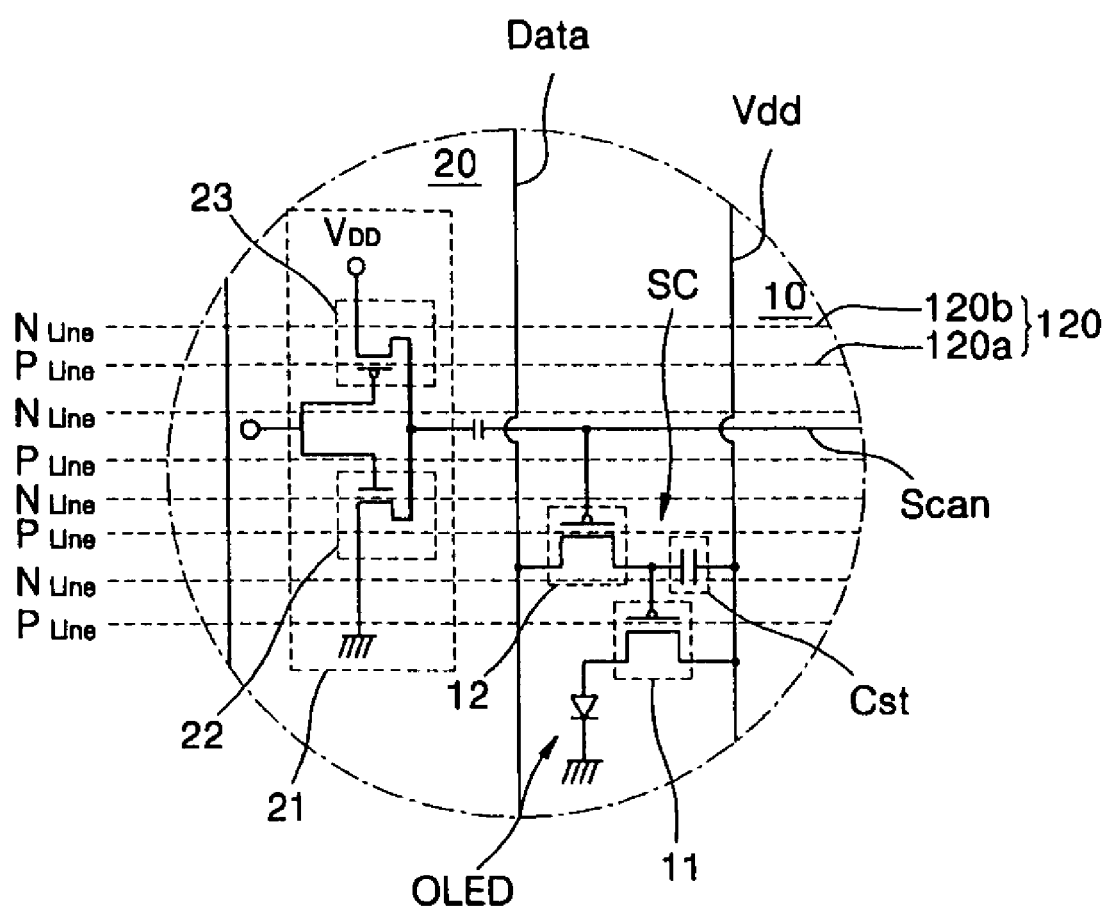
FIG. 2 is a circuit diagram of circuits within in an emission region and a non-emission region of the flat panel display of FIG. 1.

Turning now to FIG. 2, FIG. 2 is a schematic circuit diagram of a selection driving circuit (SC) of a unit pixel located in the emission region 10 and a CMOS TFT 21 in a vertical driver (VD) located in the non-emission region 20 of an OLED according to an embodiment of the present invention. The circuit diagram is not limited to that illustrated in FIG. 2, but the present invention that will be described later may be applied to a variety of circuit structures.

In an embodiment shown in FIG. 2, P-type nanoparticle lines $P_{Line}$ (120a) and N-type nanoparticle lines $N_{Line}$ (120b) are arranged in a striped shape on a substrate, extend in a plurality of rows and are partitioned off. Lengthwise directions of at least channel regions of TFTs are parallel to the nanoparticle lines 120. The P-type and N-type nanoparticle lines 120 are virtual lines partitioned off on the substrate, so as to dispose at least the channel regions of the TFTs. Thus, the TFTs need not be formed in all of the P-type and N-type nanoparticle lines 120 and may be or not be formed along the nanoparticle lines 120.

Nanoparticles, which serve as a channel of a semiconductor active layer on the nanoparticle lines 120, are situated along the nanoparticle lines 120. That is, the nanoparticles may be printed along the nanoparticle lines 120 during a manufacturing process. More detailed descriptions thereof will now be described.

Figure 3:
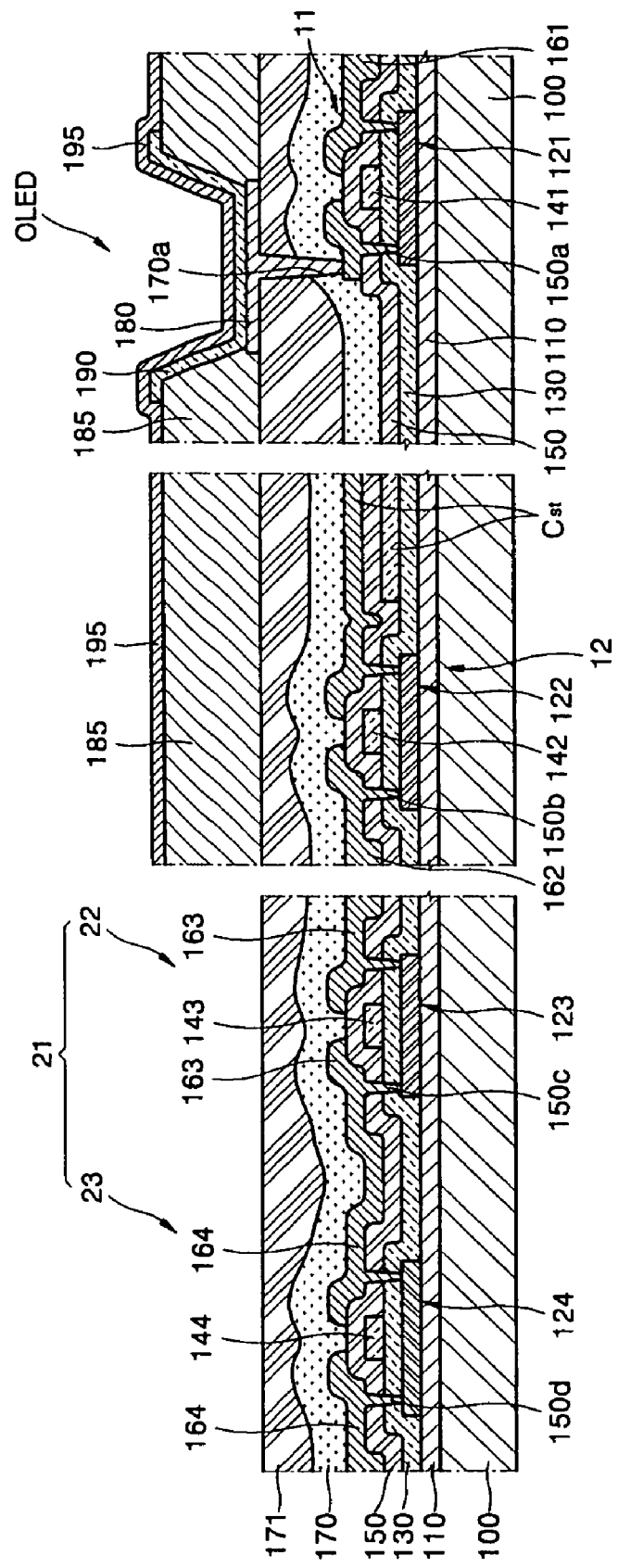
FIG. 3 is a cross-sectional view of an emission region and a non-emission region of various TFTs and an OLED of FIG. 2.

Turning now to FIG. 3, FIG. 3 is a cross-sectional view of FIG. 2, illustrating cross-sections of driving TFT 11, switching TFT 12 and a CMOS TFT 21 of a vertical driver (VD). The CMOS TFT 21 is arranged so that an N-type TFT 22 and a P-type TFT 23 are combined with each other. The above-described VD may not include only the CMOS TFT 21. A variety of TFTs and circuits may be interconnected to one another to constitute a driving circuit. The TFTs 11, 12, 22 and 23 are formed on a substrate 100 and arranged on the above-described nanoparticle lines.

The substrate 100 may be formed of acryl, polyimide, polycarbonate, polyester, mylar, or other plastic materials to allow for flexibility. It is also possible for the substrate 100 to be made of some other material, such as glass. A buffer layer 110 for preventing diffusion of impurity ions may be selectively located on the substrate 100 as occasion demands. In addition, nanoparticles that have been already formed using physical and chemical methods are arranged and patterned along the nanoparticle lines arranged on the substrate 100 such that at least a channel of each of a plurality of semiconductor active layers 121, 122, 123, and 124 of each of TFTs 11, 12, 22, and 23 is formed.

As shown in FIG. 3, a gate insulating layer 130 is made of silicon oxide and/or silicon nitride on the plurality of semiconductor active layers 121, 122, 123, and 124, each semiconductor active layer being formed of nanoparticles. Gate electrodes 141, 142, 143, and 144 of each of the TFTs 11, 12, 22, and 23 are formed on the gate insulating layer 130 through conductive metallic layers such as MoW, Al, Cr, Al/Cu, and Ti/Al/Ti, etc.

An interlevel dielectric (ILD) layer 150 formed of silicon oxide and/or silicon nitride is formed on the gate insulating layer 130 and the gate electrodes 141, 142, 143, and 144, and source/drain electrodes 161, 162, 163, and 164 of each of the TFTs 11, 12, 22, and 33 are disposed on the ILD layer 150 to be insulated from the gate electrodes 141, 142, 143, and 144. The source/drain electrodes 161, 162, 163, and 164 are formed of conductive metallic layers such as MoW, Al, Cr, Al/Cu, and Ti/Al/Ti, etc. or conductive polymer. In addition, the source/drain electrodes 161, 162, 163, and 164, respectively, are connected to source/drain regions of each of the active layers 121, 122, 123, and 124 through contact holes 150a, 150b, 150c, and 150d so that a TFT results. When forming the gate electrodes 141, 142, 143, and 144 and the source/drain electrodes 161, 162, 163, and 164, a storage capacitor Cst can be formed at the same time and of the same material as a material used to make the TFTs.

A passivation layer 170 made of silicon oxide and/or silicon nitride etc. is formed on the source/drain electrodes 161, 162, 163, and 164, and a planarization layer 171 is made of acryl, BCB, or polyimide is formed over the passivation layer 170. Via hole 170a perforates both the passivation layer 170 and the planarization layer 171 so that any one of the source and drain electrodes 161 of the driving TFT 11 is electrically exposed through the via hole 170a. The passivation layer 170 and the planarization layer 171 are not limited to that described above and may be combined into just one layer.

A pixel electrode 180, which is a lower electrode layer of the OLED, is formed on the passivation layer 171. The pixel electrode 180 is connected to one of the source and drain electrodes 161 through the via hole 170a.

A pixel definition layer 185 is made of an insulating material like an organic material such 8 as acryl, BCB, or polyimide or an inorganic material such as silicon oxide or silicon nitride. As shown in FIG. 2, the pixel definition layer 185 covers TFTs such as the driving TFT 11 and the switching TFT 12 of the selection driving circuit SC and has an opening through which a predetermined part of the pixel electrode 180 is exposed.

An organic film 190, having an emission layer, is coated on the opening through which the pixel electrode 180 is exposed. The organic film 190 may be formed on the entire surface of the pixel definition layer 185. In this case, the emission layer of the organic film 190 is patterned with red, green, and blue colors in each pixel so that full colors can be realized.

As shown in FIG. 3, the pixel definition layer 185 may not be formed in the non-emission region 20 where the a vertical and/or horizontal driver are located, but in no way is the present invention limited to such a configuration.

After the organic film 190 is formed, a common electrode 195, which serves as a lower electrode layer of the OLED, is formed. The common electrode 195 may be formed to cover all pixels but is not limited to this constraint and may be patterned. The pixel electrode 180 and the common electrode 195 may be insulated from each other by the organic film 190, and voltages of differing polarities are applied across the organic film 190 so that light can be emitted from the organic layer 190.

The pixel electrode 180 serves as an anode, and the common electrode 195 serves as a cathode, however, it is conceivable to do the opposite. The pixel electrode 180 may be a transparent electrode or a reflection electrode. The transparent electrode may be made out of ITO (indium tin oxide), IZO (indium zinc oxide), ZnO or $In_2O_3$, and after a reflection layer of Ag, Mg, Al, Pt, Pd, Au, Ni, Nd, Ir, Cr and a compound thereof is formed, the reflection electrode using ITO, IZO, ZnO or $In_2O_3$ may be formed on the reflection layer.

The common electrode 195 may also be a transparent electrode or a reflection electrode. When the transparent electrode is used as the common electrode 195, since the common electrode 195 is used as a cathode metal having a small work function, such as Li, Ca, LiF/Ca, LiF/Al, Al, Mg, and a compound thereof are deposited toward the organic film 190, an auxiliary electrode layer or a bus electrode line may be formed of a material used in forming the transparent electrode, such as ITO, IZO, ZnO or $In_2O_3$. The reflection electrode is formed by depositing metals such as Li, Ca, LiF/Ca, LiF/Al, Al, Mg, and a compound thereof on the entire surface of the OLED.

The organic film 190 may be a low or high molecular organic layer. When the low molecular organic layer is used for the organic film 190, the low molecular layer is formed by stacking a hole injection layer (HIL), a hole transport layer (HTL), an emission layer (EML), an electron transport layer (ETL), and an electron injection layer (EL) in a single or composite structure, and a variety of organic materials, such as copper phthalocyanine (CuPc), N,N'-Di(naphthalene-1-yl)-N,N'-diphenyl-benzidine (NPB), and tris-8-hydroxyquinoline aluminum ($Alq_3$) may be used for the lower molecular organic layer. These low molecular organic layers are formed by vapor deposition.

When the high molecular organic layer is used for the organic film 190, the high molecular organic layer generally may have a structure in which the HTL and the EML are formed. In this case, PEDOT is used for the HTL, and high molecular organic materials such as Poly-Phenylenevinylene and Polyfluorene are used for the EML. These high molecular organic layers are formed by screen printing or ink-jet printing etc.

Nanoparticles, that are located in the active layers of the TFTs 11, 12, 22, and 23 found in both the emission region 10 and in drivers of the non-emission region 20, are preferably nanowires extending in a lengthwise direction. At least one or more nanoparticles may be disposed in each active layer of each TFT. A channel of an active layer is designed to be parallel to the lengthwise direction of the nanowires. In no way is the present invention limited to this. The nanoparticles may instead be nano-ribbons, nanorods, or nanotubes and nanoparticles that can be formed in the lengthwise direction.

Figure 4:
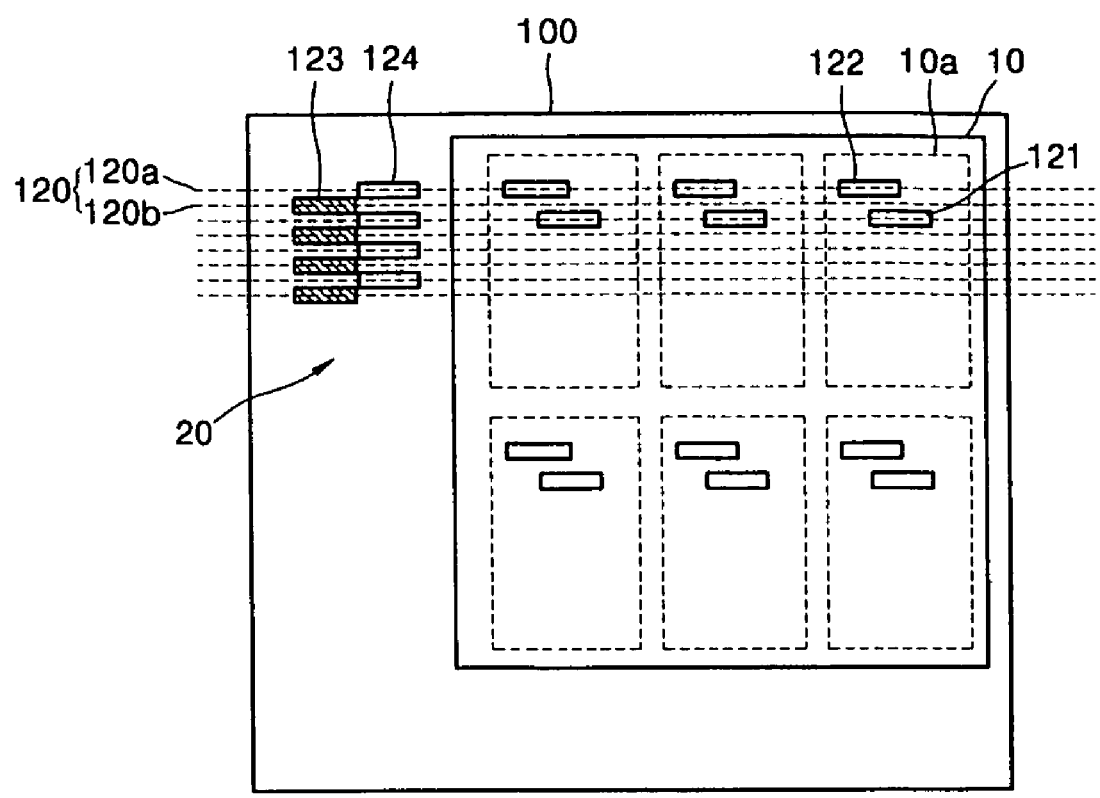
FIG. 4 is a schematic plane view of active layers of the flat panel display device according to an embodiment of the present invention.

In the present invention, active layers 121, 122, 123, and 124 are formed of nanoparticles as described above. As shown in FIG. 4, these active layers are arranged along nanoparticle lines 120 having a striped shape. The nanoparticles 120 include P-type nanoparticle lines 120a and N-type nanoparticle lines 120b and may have not only a striped shape but also a variety of shapes such as a curved etc.

The active layers 121 of the driving TFT 11, the active layers 122 of the switching TFT 12, and the active layers 124 of the P-type TFT 23 of the CMOS TFT 21, are arranged along the P-type nanoparticle lines 120a. The active layers 123 of the N-type TFT 22 of the CMOS TFT 21 are arranged along the N-type nanoparticle lines 120b.

The P- and N-type classification is not limited to the above but may be changed according to the design of a selection driving circuit in each unit pixel 10a and circuit design of a driver in the non-emission region 20. That is, any one of the active layers 121 of the driving TFT 11 of the selection driving circuit SD in the unit pixel 10a and the active layers 122 of the switching TFT 12 or both of them may be of N-type. When two or more TFTs are used for the selection driving circuit SC, both P-type and N-type active layers may be present in a single unit pixel 10a. Even in this case, the active layers of each TFT are arranged and installed along the P-type nanoparticle lines 120a and the N-type nanoparticle lines 120b, as shown in FIG. 4.

As illustrated in FIG. 4, the P-type nanoparticle lines 120a and the N-type nanoparticle lines 120b do not overlap each other. Preferably, the P-type nanoparticle lines 120a and the N-type nanoparticle lines 120b are alternately arranged. Thus, the P-type and N-type active layers 121, 122, 123, and 124 of the TFTs arranged and installed along the nanoparticle lines 120 are not arranged and installed on a single line. In other words, as shown in FIG. 4, the P-type active layers 121 of the driving TFT 1, the P-type active layers 122 of the switching TFT 12, and the P-type active layers 124 of the P-type TFT 23 of the CMOS TFT 21 may be arranged and installed on the same P-type nanoparticle lines 120a. However, the P-type active layers 121, 122, and 124 and the N-type active layer 123 of the N-type TFT 22 of the N-type CMOS TFT 21 are arranged and installed on the P-type nanoparticle lines 120a and the N-type nanoparticle lines 120b, which are separated from one another.

By arranging the nanolayers this way, the same type of TFTs among the TFTs disposed in the emission region 10 and the non-emission region 20 are disposed in such a way that lengthwise directions of at least their channel regions are parallel to each another. That is, as shown in FIG. 4, the active layers 121 of the driving TFT 11, the active layers 122 of the switching TFT 12, and the active layers 124 of the P-type TFT 23 of the CMOS TFT 21, which are all P-type active layers, are arranged and installed to be parallel to each another, and the active layers 123 of the N-type TFT 22 of the CMOS TFT 23 are arranged and installed to be parallel to one another. Although just the P-type TFT 23 is located in the emission region 10, even though the N-type TFT 22 is located in the emission region 10, the N-type TFTs located in the non-emission region 20 and active layers thereof are arranged to be parallel to one another. As shown in FIG. 4, the P-type and N-type TFTs are parallel to each other.

Figure 5:
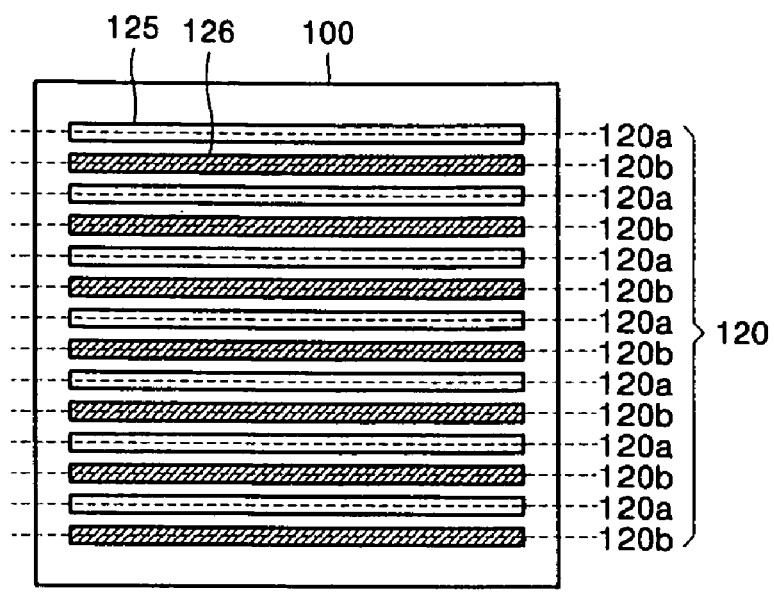
FIG. 5 is a plane view illustrating the state in that nanolayers for forming the active layers are formed.

Turning now to FIG. 5, FIG. 5 illustrates a P-type nanolayer 125 made up of P-type nanoparticles formed along the P-type nanoparticle lines 120a on the substrate 100, and a N-type nanolayer 126 made up of N-type nanoparticles is formed along the N-type nanoparticle lines 120b on the substrate 100. As shown in FIG. 4, the active layers 121, 122, 123, and 124 may be formed by patterning the nanolayers 125 and 126 according to their design patterns. The P-type and N-type nanolayers 125 and 126 may be formed in a striped shape, as shown in FIG. 5. The nanolayers 125 and 126 shown in FIG. 5 may be formed by various methods.

Figure 6A:
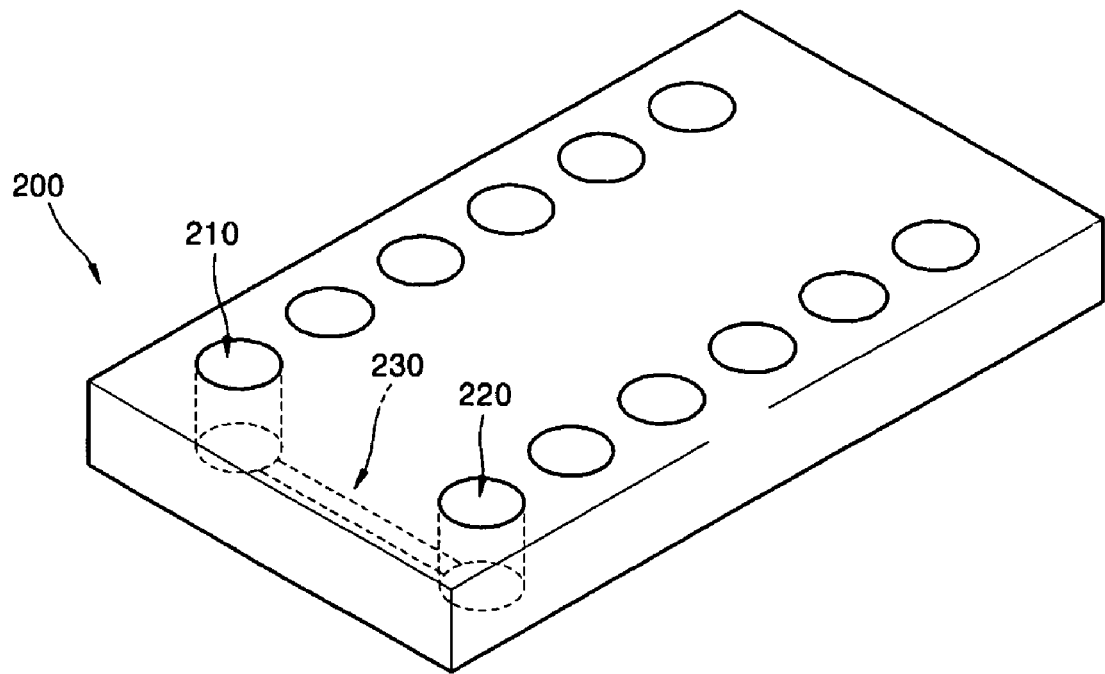
FIGS. 6A and 6B, respectively, are a schematic perspective view and a schematic plane view of a PDMS high molecular mold used in a method of forming the nanolayers shown in FIG. 5 according to an embodiment of the present invention.
Figure 6B:
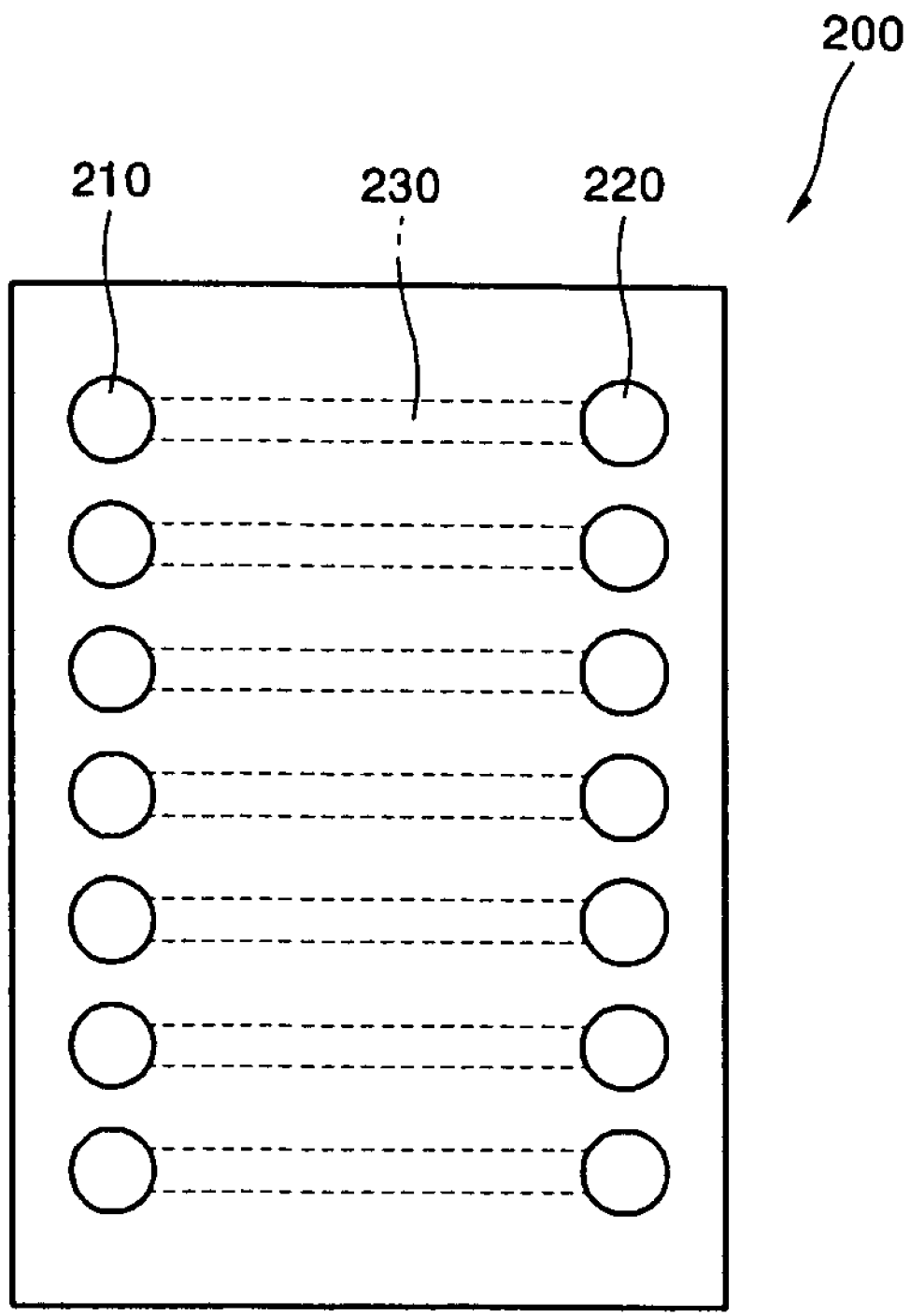

FIG. 6A is a schematic perspective view of a PDMS (or poly(dimethylsiloxane)) high molecular mold 200 for coating micro-fluid used in manufacturing an OLED according to the present invention, and FIG. 6B is a plane view of FIG. 6A. The PDMS high molecular mold 200 is a body frame formed of polydimethylsiloxane, for example. In order to form the P-type and N-type nanolayers 125 and 126 having the pattern shown in FIG. 5, on a lower portion of the PDMS high molecular mold 200, stamping lines 230 are formed in a lengthwise direction, and an inlet 210 and an outlet 220 for connecting the stamping lines 230 are formed. The stamping lines 230 are inserted to a predetermined depth from a lower bottom surface so that a nanoparticle solution injected through the inlet 210 is printed. The stamping lines 230 may have the width of 20-30 μm.

A method of manufacturing the P-type and N-type nanolayers 125 and 126 using the PDMS high molecular mold 200 will be described in the following. First, a cleaned substrate 100 is prepared. In this case, as shown in FIG. 3, a buffer layer 110 may be formed on the substrate 100. Next, a micro-fluid having nanoparticles is prepared. The nanoparticles are small particles of any one of a variety of materials, such as a group IIB-VIA compound including CdS, CdSe, and CdTe, a group IIIA-VA compound including GaAs, a group IVA element including Si and a compound thereof, and metals including Ni, Co, Fe, Pt, Au, and Ag and a compound thereof. However, the nanoparticles are not limited to the above and may be formed of other materials.

These nanoparticles can be made by physical and chemical methods, and methods of forming the nanoparticles will be described in the following. The nanoparticles may be formed by chemical methods and have a core that is made out of a group IIB-VIA compound including CdS, CdSe, and CdTe, a group IIIA-VA compound including GaAs, a group IVA element including Si and a compound thereof, and metals including Ni, Co, Fe, Pt, Au, and Ag and a compound thereof and any one of the compounds with which the core is coated.

As an example, a first operation of forming (CdSe)ZnS nanoparticles is making CdSe nanocrystals. It is well-known that the size of the nanoparticles is approximately 23-55 Å and a difference in distribution of the size is approximately 5-10%. These CdSe nanoparticles are formed by performing a high-temperature colloid growth processing process and a precipitation process of selecting the size of the nanoparticles. Here, the high-temperature colloid growth processing process is a process in which an organic metallic precursor is quickly injected into a high-temperature solvent and a homogeneous nucleus is instantaneously generated. The organic metallic precursor used as a Cd source includes an alkali cadmium compound such as $CdMe_2$. Proper organic metallic compounds used as a Se source are tri-alkyl phosphine selenide such as $(TMS)_2Se$, TOPSe, and TBPSe. Subsequently, the CdSe particles are coated with a solution including Zn and S precursors in a solvent (for example, TOP) at an appropriate temperature. Ditylzinc and hexamethyldisilatine are used as Zn and S precursors.

The nanoparticles may also be formed by a variety of physical methods such as vacuum synthesis, gas-phase synthesis, condensed phase synthesis, high-speed deposition using an ionized cluster beam, consolidation, high-speed milling, mixalloy processing, deposition, and Sol-Gel processing. However, the method of forming nanoparticles is not limited to the above-described methods. Also, the nanoparticles may have shapes such as nanowires, nano-ribbons, nanorods, or nanotubes having a single wall or multiple walls. The nanoparticles may also be formed by the following methods.

(a) P-Type Si Nanowires

P-type Si nanowires having the thickness of 20-40 nm are made by thermal deposition of $SiH_4$ and $B_2H_6$ using monodispersed gold colloid particles (manufactured by British Biocell International Ltd) as a catalyst. In this case, a temperature is between 420 and 480° C., and a reactor is adjusted so that computer-controlled growth can be performed in an 8-inch tube furnace. When a total pressure is 30 torr, a partial pressure of silane is about 2 torr, and a reaction time is 40 minutes. The ratio of $SiH_4$ to $B_2H_6$ is adjusted to be 6400:1 in consideration of a doping level. In this case, the doping concentration of nanowires is estimated to about $4 \times 10E+17$ cm$^{-3}$. As the doping level increases, a contact resistance becomes lower without having to perform a high-temperature annealing process. See Nature, 425, 274-278 (2003).

(b) N-Type Si Nanowires

N-type Si nanowires are made by laser-assisted catalytic growth (LCG). Simply, the N-type Si nanowires are made by ablating a gold target using a laser beam of Nd:YAG laser (532 nm, pulse width of 8 ns, 300 mJ/pulse, 10 Hz). Catalytic particles of gold nanocluster generated by this simple method react with $SiH_4$ gas in a reaction container and are grown to Si nanowires. In the case of doping, the N-type Si nanowires are generated by placing Au—P target (99.5:0.5 wt %, Alfa Aesar) and additional red phosphorous (99% Alfa Aesar) in a gas inlet of the reaction container. See J. Phys. Chem. B., 104, 5213-5216 (2000).

(c) N-Type GaN Nanowires

N-type GaN nanowires are formed by metal-catalyzed CVD using each of an ammonia gas (99.99%, Matheson), gallium metal (99.9999%, Alfa Aesar), and magnesium nitride ($Mg_3N_2$, 99.6%, Alfa Aesar) as a source of N, Ga, and Mg. In this case, a c-plane sapphire substrate is preferably used. $Mg_3N_2$ is thermally decomposed into $MgN_2(s)=3$ $Mg(g)+N_2(g)$, causes an Mg dopant, and is placed upstream of a Ga-source. GaN nanowires are formed at 950° C., and nickel is used as a catalyst. The GaN nanowires generally have the length of 10-40 μm. See Nano Letters, 3 (3), 343-346 (2003).

(d) N-type CdS Nano-Ribbons

CdS nano-ribbons are composed by vacuum vapor transport. In particular, a small amount of CdS powder (less than 100 mg) is sealed at an end of a vacuum tube. While the vacuum tube is heated so that the temperature of the CdS powder is 900° C., the temperature of the other end of the vacuum tube is lower than 50° C. Within 2 hours, most CdS powders are moved to a cold place and stuck on walls of the vacuum tube. The materials are mostly nano-ribbons having the thickness of 30-150 nm. The nano-ribbons have the width of 0.5-5 μm and the length of 10-200 μm. See Nature, 425, 274-278 (2003).

(e) Ge Nanowires $H_2$ (total atmosphere=1 atm) is flown at a speed of 100 sccm in a furnace reactor having a diameter of 2.5 cm and simultaneously, the speed of $GeH_4$ (10% in He) is 10 sccm, and CVD is performed for 15 minutes at 275° C., thus forming Ge nanowires. A reaction substrate is a substrate in which Au nanocrystals (having a diameter of 20 nm on the average) are uniformly dispersed onto the surface of an $SiO_2$ substrate. See Agnew. Chem. Int. Ed. Engls, 41, 4783-4786 (2002).

(f) InP Nanowires

InP nanowires are formed by LCG. A LCG target is generally composed of 94% InP, 5% Au catalysts, and 1% Te or Zn doping element. While the LCG target is grown, the temperature of a furnace is 800° C. (medium), and the LCG target is placed at an upstream end of the furnace. Pulses of Nd-YAG laser (having the wavelength of 1064 nm) are emitted for 10 minutes. In this case, nanowires are collected at a downstream end of a cold place of the furnace. See Nature, 409, 66-69 (2001).

(g) ZnO Nanorods

Zinc acetate dihydrate ($ZnOCOCH_3$-$2H_2O$) approximately 29.5 g (0.13 mol) is melted in methanol 125 mL at 60° C., and then a solution in which potassium hydroxide (KOH) 14.8 g (0.23 mol) is melted is added to methanol 65 ml, thus forming ZnO nanorods. A reaction mixture is agitated at 60° C. four several days. If the nanorods are precipitated within several days, a precipitation is washed with methanol and centrifugally separated at 5500 rpm for 30 minutes. Nanoparticles, which are resultant materials caused by the above-described procedure, are diluted using a solvent having the ratio of ethylene glycol to water 2:1 and become a solution. By ripening the solution for about three days, nanorods having a diameter of 15-30 nm and a length of 200-300 nm are formed. On the other hand, nanowires can also be formed by CVD. See Nano Letters, 3 (8), 1097-1101 (2003).

The nanoparticles are formed by a general wet chemical method using a colloid solution containing nanoparticles. See Langmuir, 1998, Vol. 14, p. 226. For example, the colloid solution containing nanoparticles may be prepared by putting already-made nanowires or nanoribbons into ethanol and then mixing them homogeneously using ultrasonic waves.

A very small amount of the nanoparticle colloid solution is flown into the inlet 210 of the PDMS high molecular mold 200. In this case, the stamping lines 230 of the PDMS high molecular mold 200 are aligned in the P-type nanoparticle lines 120a or the N-type nanoparticle lines 120b so that the P-type nanolayer 125 or the N-type nanolayer 126 is formed along the lines 120a or 120b, as shown in FIG. 5. In this case, preferably, the nanolayers 125 and 126 are separated from each other by a predetermined gap, for example, by a pitch of a unit pixel.

Next, the fluid is dried at room temperature. For a quick dry operation, preferably, a thermal treatment is performed at an appropriate temperature (not extremely high). As a result, the plurality of nanolayers 125 and 126 shown in FIG. 5 are formed.

Next, the nanolayers 125 and 126 are patterned so that the semiconductor active layers 121, 122, 123, and 124 of the TFTs located in the emission region 10 and the non-emission region 20 are formed, as shown in FIG. 4. Next, subsequent processes are performed so that an OLED having the structure of FIG. 3 is formed.

The structure of the nano TFT need not be a stacked structure as in FIG. 3. The gate electrodes 141, 142, 143, and 144 may be formed on the buffer layer 110 of the substrate 100, the gate insulating layer 150 may be formed to cover them, and the nanolayers 125 and 126 shown in FIG. 5 may be formed on the gate insulating layer 150.

The nanolayers 125 and 126 shown in FIG. 5 may be formed by various methods. As an example, the nanolayers 125 and 126 may be formed by Amine processing through stamping using a PDMS high molecular mold on a substrate, and then by patterning shown in FIG. 5 through a well-known ink-jet printing method. In the ink-jet printing method, a pattern can be formed up to a width of 20 microns. Also, as another example, the nanolayers 125 and 126 may be formed by a laser induced thermal imaging (LITI) method.

Figure 7A:
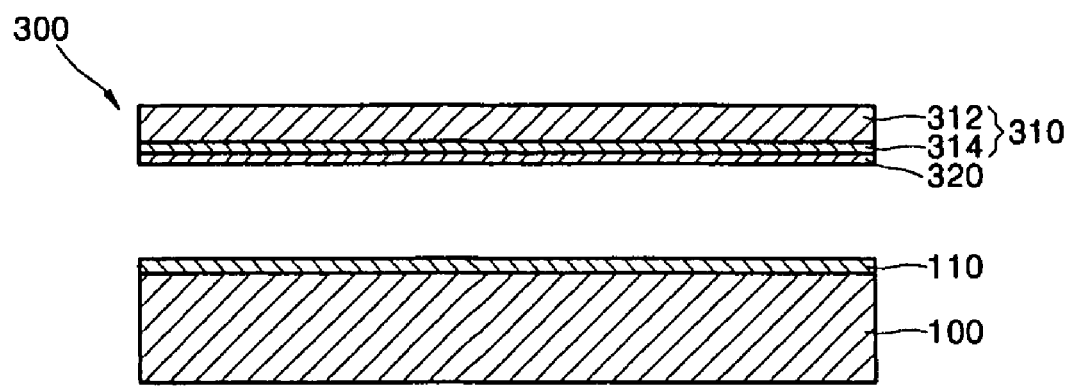
FIGS. 7A through 7C are cross-sectional views of a method of forming the nanolayers shown in FIG. 5 according to another embodiment of the present invention.
Figure 7B:
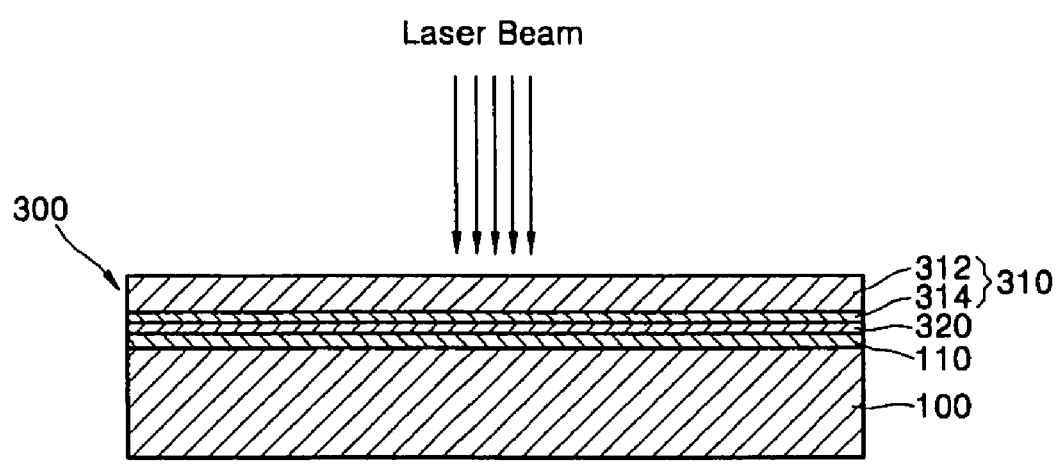
Figure 7C:
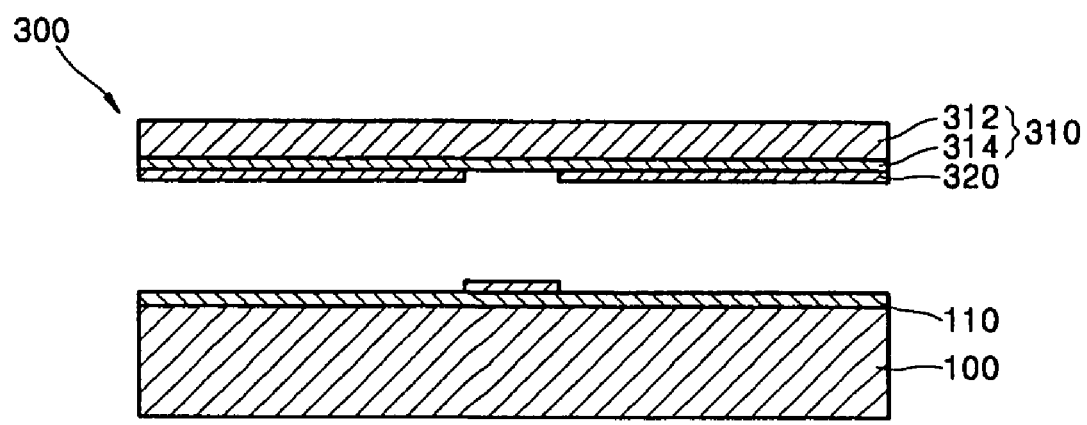
Figure 8:
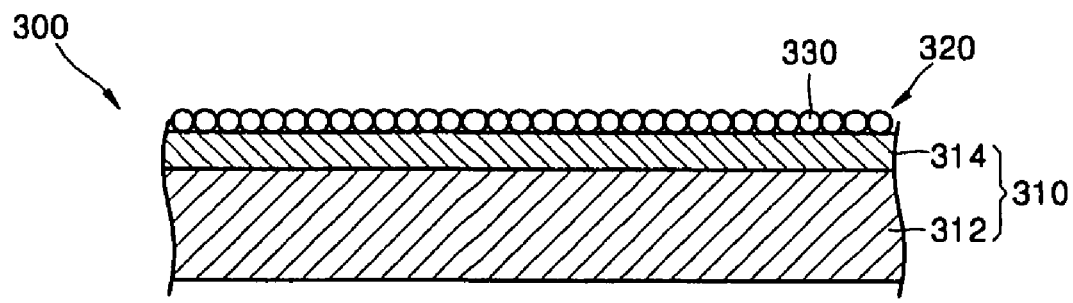
FIG. 8 is a cross-sectional view of a donor sheet used in the method shown in FIGS. 7A through 7C.
Figure 9A:
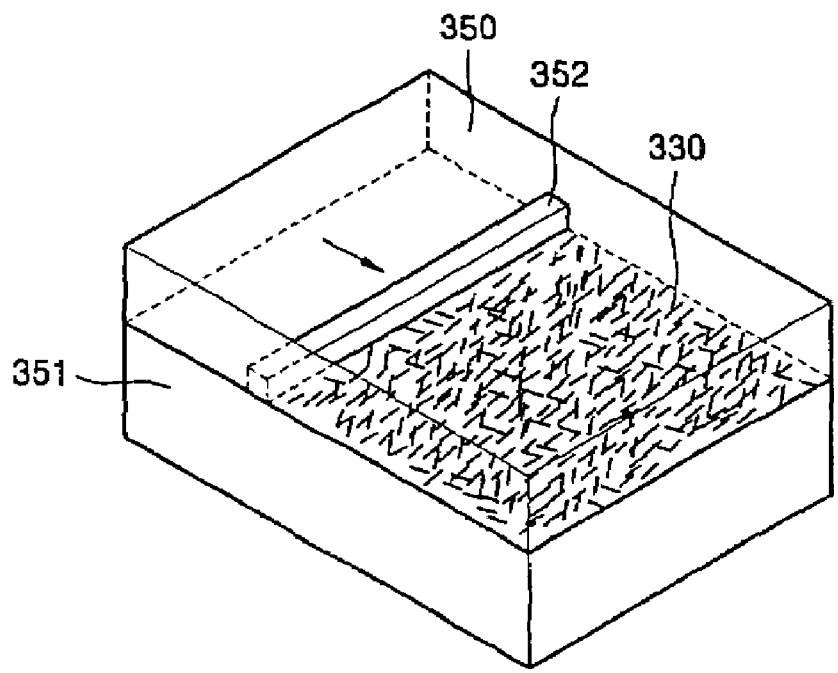
FIGS. 9A and 9B illustrate a method of manufacturing a donor sheet shown in FIG. 8 according to an embodiment of the present invention.
Figure 9B:
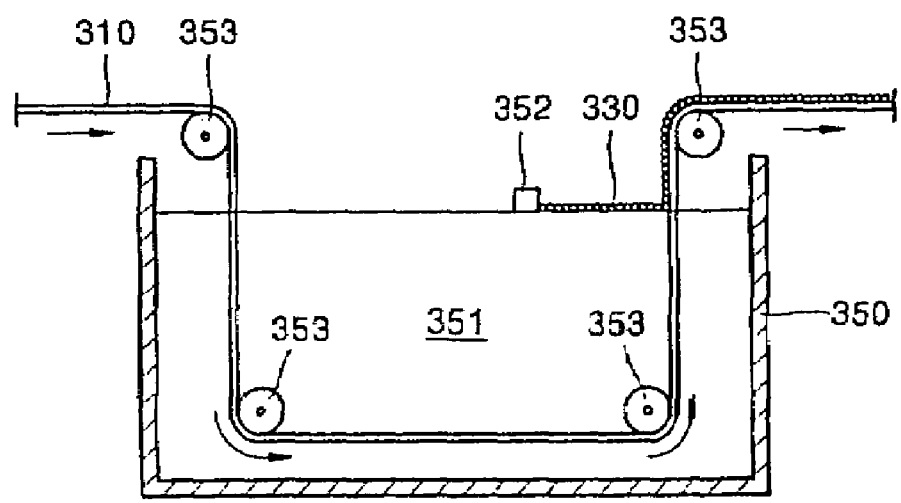
Figure 10:
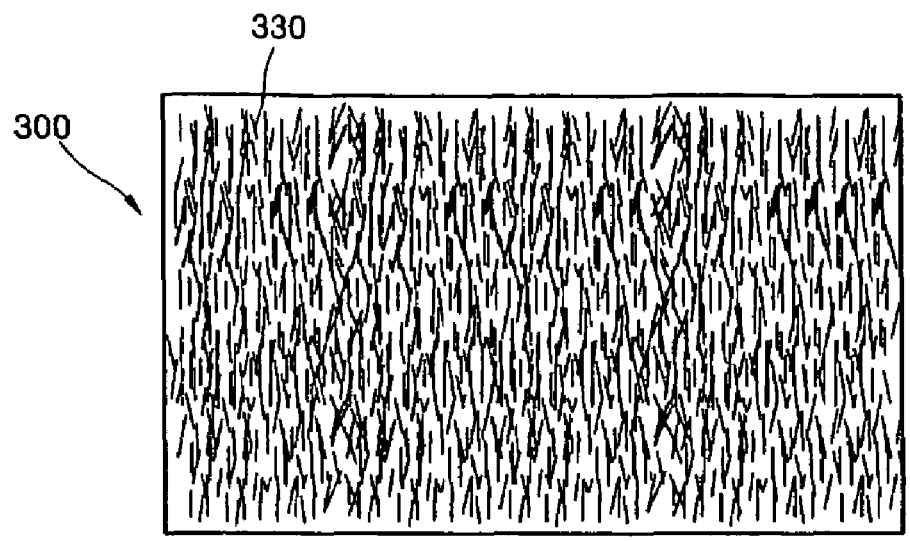
FIG. 10 is a plane view of a donor sheet manufactured by the method shown in FIGS. 9A and 9B.

Turning now to FIGS. 7A through 10, FIGS. 7A through 7C illustrate a method of forming patterned nanolayers as illustrated in FIG. 5 by an LITI method, and FIG. 8 illustrates a cross-section of a donor sheet in the method shown in FIGS. 7A through 7C. FIGS. 9A and 9B illustrate an example of a method of manufacturing the donor sheet, and FIG. 10 illustrates the plane of the donor sheet manufactured by the method shown in FIGS. 9A and 9B.

First, in the method of forming the nanolayer by the LITI method, a donor sheet 300 shown in FIG. 8 is used. Nanowires 330 of the donor sheet 300 are arranged to be parallel to their lengthwise directions on a film 310, thus forming a transfer layer 320.

The film 310 includes a base film 312 and a light-to-heat conversion (LTHC) layer 314. A polyolefin-based resin may be used as the base film 312. The LTHC layer 314 may be coated on the base film 312 by agitating carbon in acryl, but is not limited to this. The LTHC layer 314 may be a layer that transfers the transfer layer 320 by converting laser light into heat and heating the transfer layer 320 or causes ablation of laser.

The donor sheet 300 may be manufactured by the method shown in FIGS. 9A and 9B. A plurality of nanowires 330 are mixed in a water bank 350 in which a solution 351 such as water resides. In this case, the nanowires 330 may be P-type nanowires or N-type nanowires as described above. These nanowires 330 are arranged in an irregular direction in a floated state on the solution 351.

If in this state, the nanowires 330 on the surface of the solution 351 are pulled out toward one side using an alignment bar 352, the nanowires 330 are pulled out toward the alignment bar 352 and collected to one side. Since the nanowires generally have a diameter or thickness of about 30 nm and a length of 40-50 μm, an aspect ratio thereof is very high. Thus, the collected nanowires 330 are aligned approximately in one direction, and the alignment direction is parallel to the lengthwise directions of the nanowires 330.

If in this state, the film 310 is continuously supplied into to a water bank 350 and simultaneously the nanowires 330 are attached to the surface of the film 310 as shown in FIG. 9B, a donor sheet 300 shown in FIGS. 8 and 10 can be manufactured. In other words, a plurality of rollers 353 are installed in the water bank 350, and the film 310 perforates the water bank 350 using the rollers 353. In this case, the film 310 is made up of the base film 312 and the LTHC layer 314 formed on the base film 312, as shown in FIG. 8. The film 310 allows the LTHC layer 314 to perforate the water bank 350 so that the nanowires 330 are bonded to the LTHC layer 314 and the LTHC layer 314 is placed in the direction of the nanowires 330.

When the nanowires 330 are bonded to the LTHC layer 314 through the water bank 350, since the nanowires 330 are collected to one side of the water bank 350, they are aligned approximately in one direction. Even though these nanowires 330 are bonded to the LTHC layer 314 of the film 310, their alignment state can be maintained. After the film 310 in which the nanowires 330 are aligned is dried and cut to a predetermined length, the donor sheet 300 in which the nanowires 330 are aligned in one direction can be manufactured, as shown in FIG. 10.

In the method of manufacturing the donor sheet 300, since the film 310 is supplied in-line to the water bank 350, Roll-to-Roll processing can be performed, and then, many donor sheets 300 can be manufactured. As a result, productivity can be improved.

As shown in FIG. 7A, the donor sheet 300 is seated on the substrate 100 in which the buffer 110 is formed. As shown in FIG. 7B, the donor sheet 300 and the substrate 100 are laminated to each other and provisionally bonded to each other. If in this state, a laser beam is emitted to a predetermined portion in which a pattern is to be formed, and the donor sheet 300 and the substrate 100 are separated from each other, a predetermined pattern is formed on the substrate 100 as shown in FIG. 7C. Thus, as shown in FIG. 5, one of the P-type nanolayer 125 and the N-type nanolayer 126 can be formed. If the laser patterning is performed in a state where a donor sheet in which nanowires having another shape are aligned is shifted by one line, another nanolayer can be formed. In this way, as shown in FIG. 5, the nanolayers 125 and 126 are formed along the nanoparticles 120, patterned to form an active layer pattern shown in FIG. 4, and by performing subsequent processes such as a process of manufacturing a TFT and a process of manufacturing an OLED, the OLED display can be manufactured, as shown in FIG. 3. A general transfer method by which a pattern is formed on a substrate by applying pressure to a predetermined pattern formed in a donor film can be used as well as the LITI method.

As shown in FIG. 5, the nanolayers 125 and 126 are formed along the nanolines 120 and patterned, thus forming the active layers shown in FIG. 4. However, the present invention is not limited to this, and the active layers shown in FIG. 4 may be patterned without forming the nanolayers 125 and 126 shown in FIG. 5.

That is, in the method shown in FIGS. 6A and 6B, the stamping lines 230 are patterned to a size corresponding to an active layer, thus forming a nanolayer only in a portion of the stamping lines 230, and even in the ink-jet printing method, a nozzle is moved along a corresponding nanoparticle line, thus forming a nanolayer only in a portion of a predetermined active layer. In addition, even in the transfer method including the LITI method shown in FIGS. 7A through 7C, a nanolayer is formed only in a portion of a corresponding active layer, thus forming an active layer.

Figure 11:
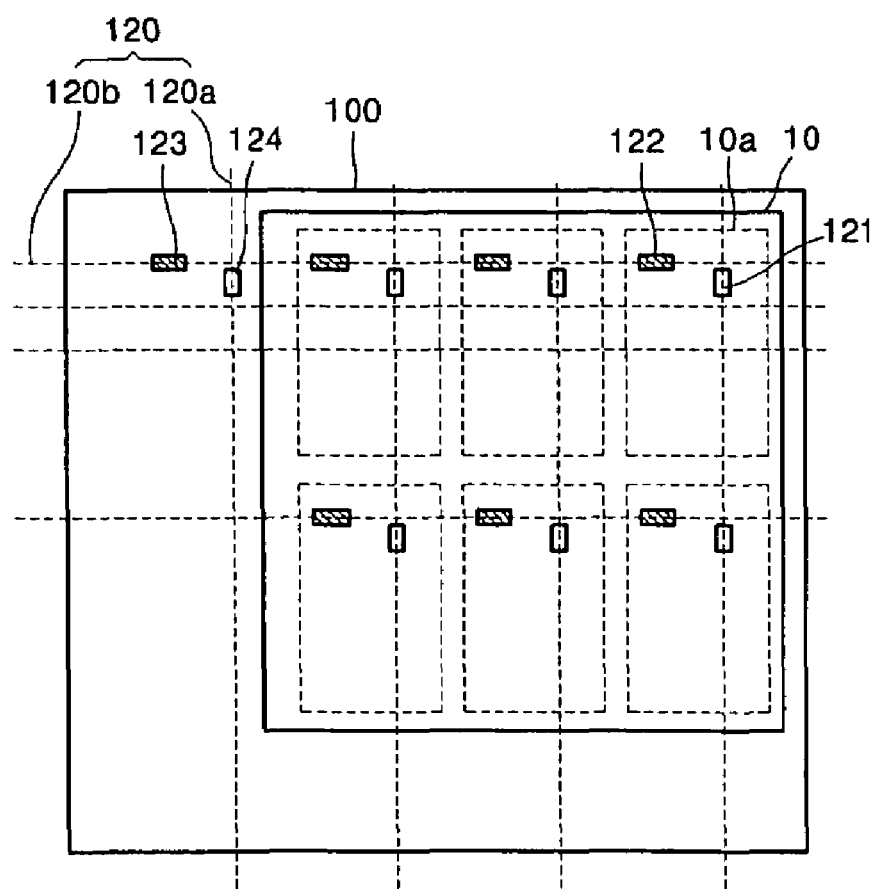
FIG. 11 is a schematic plane view of active layers of a flat panel display device according to another embodiment of the present invention.

As shown in FIGS. 4 and 5, the P-type nanoparticle lines 120a and the N-type nanoparticle lines 120b can be alternately arranged to be parallel to one another. In addition, as shown in FIG. 11, the P-type nanoparticle lines 120a and the N-type nanoparticle lines 120b can be arranged to cross one another. In this case, the active layer 121 of the driving TFT may be a P-type and the active layer 122 of the switching TFT may be an N-type but is not limited to this and may be changed according to design of a selection driving circuit of a unit pixel.

As described above, the same type of TFTs among the TFTs disposed in the emission region 10 and the non-emission region 20 are disposed in such a way that lengthwise directions of at least their channel regions are parallel to one another. That is, as shown in FIG. 4, the active layers 121 of the driving TFT 11 and the active layers 124 of the P-type TFT 23 of the CMOS TFT 21, which are active layers of the P-type TFT 23, are arranged and installed to be parallel to one another, and the active layers 122 of the switching TFT 12 and the active layers 123 of the N-type TFT 22 of the CMOS TFT 21, which is an active layer of the N-type TFT 22, are arranged and installed to be parallel to one another. In addition, the P-type and the N-type can be arranged and installed to cross each other as illustrated in FIG. 11.

Even when the P-type nanoparticle lines 120a and the N-type nanoparticle lines 120b are arranged to cross one another, the above-described methods can be used. That is, in the method shown in FIGS. 6A and 6B, patterning is performed in the stamping lines 230, thus forming a nanolayer only in a portion of the stamping lines 230.

Even in the ink-jet printing method, a nozzle is moved along a corresponding nanoparticle line, thus forming a nanolayer only in a portion of a predetermined active layer. In addition, even in the transfer method including the LITI method shown in FIGS. 7A through 7C, a nanolayer is formed only in a portion of a corresponding active layer, thus forming an active layer.

The present invention is not limited to an OLED display, but can be applied to a variety of flat panel display devices having TFTs such as a liquid crystal display (LCD), an inorganic light-emitting diode, and a LED.

As described above, the present invention has the following effects. First, by using nanoparticles in a channel of a TFT, a TFT, a flat panel display device having the same, in particular, an organic light-emitting diode (OLED) display can be manufactured at room temperature or low temperature without performing a high-temperature process. Second, as a result, plastic materials having low heat resistance can be used in a flat panel display device, in particular, an OLED display. Accordingly, the present invention is more advantageous to the manufacture of a flexible flat panel display device. Third, a channel is formed using nanoparticles arranged in a lengthwise direction such that mobility can be further improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a thin film transistor, comprising:
    partitioning a plurality of nanoparticle lines;
    forming nanolayers on the nanoparticle lines, each nanoparticle line comprising a nanoparticle; and
    forming an active layer by patterning the nanolayers.

2. The method of claim 1, wherein the nanoparticle lines comprise P-type nanoparticle lines and N-type nanoparticle lines, and the nanolayers comprise P-type nanolayers and N-type nanolayers, and the P-type nanolayers and the N-type nanolayers, respectively, are arranged along the P-type nanoparticle lines and the N-type nanoparticle lines.

3. The method of claim 1, a lengthwise direction of each of the nanoparticles being parallel to a lengthwise direction of each of the nanolayers.

4. The method of claim 1, the nanoparticles being selected from the group consisting of nanowires, nanorods and nanoribbons.

5. The method of claim 1, each of the nanoparticle lines having a striped shape.

6. The method of claim 1, the forming of the nanolayers comprises:
    applying a solution comprising one of P-type nanoparticles and N-type nanoparticles along the nanoparticle lines; and
    drying the coated solution.

7. The method of claim 1, the forming of the nanolayers comprises:
    forming a donor sheet comprising one of aligned P-type nanoparticles and aligned N-type nanoparticles;
    aligning the donor sheet to a substrate, the substrate being an acceptor;
    emitting a laser beam onto the donor sheet along the nanoparticle lines causing the nanoparticles to transfer from the donor sheet to the substrate according to a pattern formed by the laser beam; and
    separating the donor sheet from the substrate.

8. The method of claim 7, the forming of the donor sheet comprises:
    preparing a film comprising a light-to-heat conversion layer on one side of the film;
    preparing a water bank so that one of P-type nanoparticles and N-type nanoparticles float in a solution within the water bank;
    collecting the nanoparticles at one side of the water bank;
    allowing the film to travel through the solution in the water bank so that the nanoparticles become attached to the light-to-heat conversion layer of the film; and
    drying the film.

9. A method of manufacturing a flat panel display device, comprising:
    providing the flat panel display device comprising an emission region comprising a plurality of pixels and a selection driving circuit comprising a thin film transistor comprising a semiconductor active layer arranged in each of the pixels;
    partitioning a plurality of nanoparticle lines;
    forming nanolayers on one of said nanoparticle lines, each nanoparticle line comprising a nanoparticle; and
    forming an active layer by patterning the nanolayers.

10. The method of claim 9, each nanoparticle line comprises one of a P-type nanoparticle line and an N-type nanoparticle line, and each nanolayer comprises one of P-type nanolayers and N-type nanolayers, and the P-type nanolayers and the N-type nanolayers are formed along the P-type nanoparticle lines and the N-type nanoparticle lines, respectively.

11. The method of claim 9, a lengthwise direction of each nanoparticle is parallel to a lengthwise direction of a corresponding nanolayer.

12. The method of claim 9, the nanoparticles being selected from the group consisting of nanowires, nanorods and nanoribbons.

13. The method of claim 9, the plurality of nanoparticle lines being striped shape.

14. The method of claim 9, wherein the forming of the nanolayers comprises:
    applying a solution comprising one of P-type nanoparticles and N-type nanoparticles along the nanoparticle lines; and
    drying the applied solution.

15. The method of claim 9, wherein the forming of the nanolayers comprises:
    forming a donor sheet comprising one of aligned P-type nanoparticles and N-type nanoparticles;
    aligning the donor sheet to a substrate, the substrate serving as an acceptor for the nanoparticles;
    emitting a laser beam onto the donor sheet along the nanoparticle lines causing nanoparticles exposed to the laser beam to transfer from the donor sheet to the substate; and
    separating the donor sheet from the substrate.

16. The method of claim 9, wherein the forming of the donor sheet comprises:
    preparing a film comprising a light-to-heat conversion layer on one side thereof;
    preparing a water bank comprising a solution comprising one of P-type nanoparticles and N-type nanoparticles;
    collecting the nanoparticles in the solution to an alignment bar;
    immersing the film into the solution in the water bank causing the nanoparticles to attach to the light-to-heat conversion layer of the film; and
    drying the film.

17. The method of claim 16, the film is formed in a rolled shape and is continuously scrolled through the solution in the water bank.

18. The method of claim 9, each pixel comprising an organic light-emitting diode comprising an electrode that is electrically connected to the selection driving circuit.

19. A method of manufacturing a donor sheet, the method comprising:
    preparing a film having one side formed of a light-to-heat conversion layer;
    preparing a water bank comprising a solution comprising one of P-type nanoparticles and N-type nanoparticles;
    collecting the nanoparticles to one side;
    allowing the film to travel through the solution in the water bank so that the nanoparticles become attached to the light-to-heat conversion layer of the film; and
    drying the film.

20. The method of claim 19, the film is formed in a rolled shape and is continuously scrolled through the solution in the water bank.

* * * * *